United States Patent
Song et al.

(10) Patent No.: US 8,431,103 B2
(45) Date of Patent: Apr. 30, 2013

(54) METHOD OF MANUFACTURING GRAPHENE, GRAPHENE MANUFACTURED BY THE METHOD, CONDUCTIVE FILM COMPRISING THE GRAPHENE, TRANSPARENT ELECTRODE COMPRISING THE GRAPHENE, AND RADIATING OR HEATING DEVICE COMPRISING THE GRAPHENE

(75) Inventors: Young-il Song, Changwon (KR);
Jong-hyun Ahn, Suwon (KR);
Young-bin Lee, Suwon (KR);
Byung-hee Hong, Suwon (KR)

(73) Assignees: Samsung Techwin Co., Ltd.,
Changwon-Si (KR); Sungkyunkwan University Foundation for Corporate,
Suwon-Si (KR)

( * ) Notice: Subject to any disclaimer, the term of this patent is extended or adjusted under 35 U.S.C. 154(b) by 0 days.

(21) Appl. No.: 12/887,071

(22) Filed: Sep. 21, 2010

(65) Prior Publication Data

US 2011/0070146 A1 Mar. 24, 2011

(30) Foreign Application Priority Data

Sep. 21, 2009 (KR) .......................... 10-2009-0089289

(51) Int. Cl.
*C01B 31/04* (2006.01)
*C23F 4/00* (2006.01)

(52) U.S. Cl.
USPC .............................. 423/448; 216/52; 977/734

(58) Field of Classification Search .................. 423/448; 216/52; 977/734
See application file for complete search history.

(56) References Cited

U.S. PATENT DOCUMENTS

| | | | |
|---|---|---|---|
| 2007/0122974 A1 | 5/2007 | Tanaka | |
| 2008/0237533 A1 | 10/2008 | Araujo Moreira et al. | |
| 2009/0110627 A1* | 4/2009 | Choi et al. | ................. 423/447.1 |
| 2009/0308520 A1 | 12/2009 | Shin et al. | |
| 2010/0021708 A1 | 1/2010 | Kong et al. | |
| 2012/0012796 A1 | 1/2012 | Chen et al. | |

FOREIGN PATENT DOCUMENTS

| | | |
|---|---|---|
| JP | 2009-62247 A | 3/2009 |
| JP | 2009-200177 A | 9/2009 |
| KR | 10-0883282 | 2/2009 |
| KR | 10-2009-0126057 A | 12/2009 |
| KR | 10-2009-0126058 A | 12/2009 |
| KR | 10-2009-0129176 A | 12/2009 |

OTHER PUBLICATIONS

Yu, et al., Graphene segregated on Ni surfaces and transferred to insulators, Applied Physics Letters 2008; 93: 113103.*

(Continued)

*Primary Examiner* — Daniel C McCracken
(74) *Attorney, Agent, or Firm* — Sughrue Mion, PLLC

(57) ABSTRACT

Provided are a method of manufacturing graphene, graphene manufactured by the method, a conductive thin film including the graphene, a transparent electrode comprising the graphene, and a radiating or heating device comprising the graphene. The method includes: preparing a graphene member including a base member, a hydrophilic oxide layer formed on the base member, a hydrophobic metal catalyst layer formed on the oxide layer, and graphene grown on the metal catalyst layer; applying water to the graphene member; separating the metal catalyst layer from the oxide layer; and removing the metal catalyst layer using an etching process.

12 Claims, 4 Drawing Sheets

OTHER PUBLICATIONS

Lee, et al., Wafer-Scale Synthesis and Transfer of Graphene Films, Nano Lett. 2010; 10: 490-493 (published online Jan. 4, 2010).*

Keun Soo Kim et. al.: "Large-Scale Pattern Growth of Graphene Films for Stretchable Transparent Electrodes" doi:10.1038/nature 07719; © 2009 Macmillan Publishers Limited. All rights reserved. Published Jan. 14, 2009. pp. 1-5.

Keun Soo Kim, et al., "Large-Scale Pattern Growth of Graphene Films for Stretchable Transparent Electrodes" Macmillan Pub Ltd, Jan. 14, 2009, pp. 1-5, with Supplemental Info.

Communication dated Aug. 31, 2012 from the State Intellectual Property Office of P.R. China in a counterpart application No. 201010292705.7.

* cited by examiner

METHOD OF MANUFACTURING GRAPHENE, GRAPHENE MANUFACTURED BY THE METHOD, CONDUCTIVE FILM COMPRISING THE GRAPHENE, TRANSPARENT ELECTRODE COMPRISING THE GRAPHENE, AND RADIATING OR HEATING DEVICE COMPRISING THE GRAPHENE

CROSS-REFERENCE TO RELATED PATENT APPLICATION

This application claims priority from Korean Patent Application No. 10-2009-0089289, filed on Sep. 21, 2009 in the Korean Intellectual Property Office, the disclosure of which is incorporated herein in its entirety by reference.

BACKGROUND

1. Field

Methods and apparatuses consistent with exemplary embodiments relate to manufacturing graphene, and more particularly to a method of manufacturing graphene, graphene manufactured by the method, a conductive thin film including the graphene, a transparent electrode including the graphene, and a radiating or heating device including the graphene.

2. Description of the Related Art

Recently, graphite materials such as fullerenes, carbon nanotubes, graphene, and graphite have attracted attention.

In particular, experiments have been performed on carbon nanotubes and graphene. Because graphene can be formed into large scale films and has electrical, mechanical, and chemical stability, in addition to high conductivity, graphene has drawn much attention as a basic element for electronic circuits.

In recent years, techniques for manufacturing large scale graphene have greatly improved. A method of manufacturing graphene using a chemical vapor deposition (CVD) method is disclosed in the article "Large-Scale Pattern Growth of Graphene Films for Stretchable Transparent Electrodes" published in Nature Magazine, No. 07719, on Jan. 14, 2009, the contents of which are incorporated herein by reference in their entirety.

A related art method of manufacturing graphene using a CVD method is as follows. First, a silicon wafer having a silicon oxide ($SiO_2$) is prepared. Next, a metal catalyst layer is formed by depositing a metal catalyst, such as Ni, Cu, Al, or Fe, on the silicon oxide layer using a sputtering apparatus or an e-beam evaporator.

Next, the silicon wafer on which the metal catalyst layer is formed and a gas containing carbon, such as $CH_4$, $C_2H_2$, $C_2H_4$, or CO, are put into a reactor for performing inductive coupled plasma chemical vapor deposition (ICP-CVD). Then, the reactor is heated so that carbon can be absorbed into the metal catalyst layer. Next, the reactor is rapidly cooled to crystallize and separate the carbon from the metal catalyst layer, thus growing graphene.

The grown graphene undergoes a transfer process before use. For this purpose, an etching method is used.

SUMMARY OF THE INVENTION

Exemplary embodiments provide a method of rapidly separating graphene from a graphene member on which the graphene is formed.

According to an aspect of an exemplary embodiment, there is provided a method of manufacturing graphene, including: preparing a graphene member including a base member, a hydrophilic oxide layer formed on the base member, a hydrophobic metal catalyst layer formed on the oxide layer, and growing graphene on the metal catalyst layer; applying water to the graphene member; separating the metal catalyst layer from the oxide layer; and removing the metal catalyst layer using an etching process. The base member may include silicon (Si).

The oxide layer may include silicon oxide ($SiO_2$).

The metal catalyst layer may include at least a metal selected from the group consisting of Ni, Cu, Al, Fe, Co, and W. Also, the metal catalyst may be Ni or Cu in a foil state not a metal catalyst layer based on a wafer.

The preparing the graphene member may further include disposing a transfer member onto the graphene.

The transfer member may include a material selected from the group consisting of polydimethylsiloxane (PDMS), polyethylene terephthalate (PET), polyimide, glass, synthesized rubber, and natural rubber.

In the applying water to the graphene member, a gap may be generated between the oxide layer and the metal catalyst layer by water penetrating between the oxide layer and the metal catalyst layer.

The applying water to the graphene member may include ultrasonic wave processing of the graphene member.

The applying water to the graphene member may be performed by soaking the graphene member in water in a water bath.

The separating the metal catalyst layer from the oxide layer may be performed while the graphene member is soaked in water in the water bath.

The separating the metal catalyst layer from the oxide layer may be performed by applying a predetermined force to the graphene member.

The etching process may be performed by using at least one solution selected from the group consisting of an acid, a hydrogen fluoride solution, a buffered oxide etch (BOE) solution, a $FeCl_3$ solution, and a $Fe(No_3)_3$ solution.

The method may further include, after the removing the metal catalyst layer using the etching process, transferring the graphene onto a substrate or a device.

According to an aspect of another exemplary embodiment, there is provided graphene obtained from the methods described above.

According to an aspect of another exemplary embodiment, there is provided a conductive thin film including the graphene obtained from the methods described above.

According to an aspect of another exemplary embodiment, there is provided a transparent electrode including the graphene obtained from the methods described above.

According to an aspect of another exemplary embodiment, there is provided a radiating or heating device including the graphene obtained from the methods described above.

BRIEF DESCRIPTION OF THE DRAWINGS

The above and other aspects will become more apparent by describing in detail exemplary embodiments with reference to the attached drawings in which.

DETAILED DESCRIPTION OF THE INVENTION

Exemplary embodiments will now be described more fully with reference to the accompanying drawings.

Figure 1:
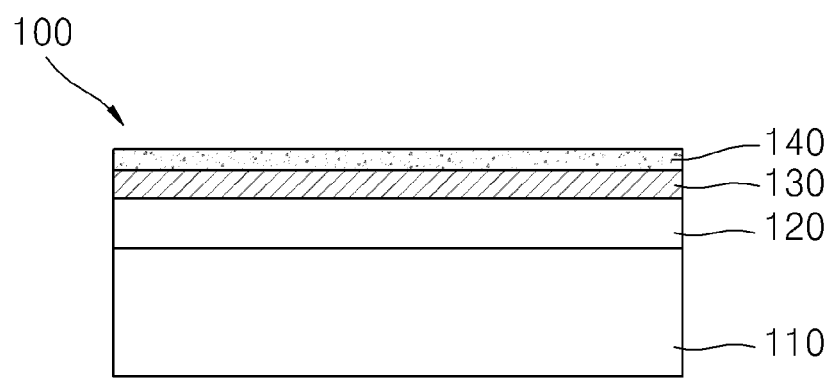
FIG. 1 is a cross-sectional view of a graphene member according to an embodiment.

FIG. 1 is a cross-sectional view of a graphene member 100 according to an exemplary embodiment. The graphene member 100 includes graphene 140 that is sufficiently grown by using, for example, a conventional chemical vapor deposition method (CVD). The graphene has not been transferred yet.

Referring to FIG. 1, the structure of the graphene member 100 will now be described.

The graphene member 100 includes a base member 110, an oxide layer 120, a metal catalyst layer 130, and the graphene 140.

The base member 110 is a substrate, such as, for example, a wafer.

The material forming the base member 110 is not particularly limited, but according to an exemplary embodiment the material forming the base member 110 is silicon (Si). In an exemplary embodiment, the base member 110 is a silicon wafer.

The oxide layer 120 may be formed of silicon oxide ($SiO_2$) and has a thickness greater than, for example, 300 nm. The oxide layer 120 has a hydrophilic property according to the property of silicon oxide.

The oxide layer 120 according to an exemplary embodiment is formed of silicon oxide ($SiO_2$), but is not limited thereto. That is, there is no specific limit in selecting the material for forming the oxide layer 120, and any material can be used as long as the material has a hydrophilic property and can readily form the metal catalyst layer 130.

The metal catalyst layer 130 is formed of Ni on the oxide layer 120 to a thickness of greater than, for example, 100 nm using a sputtering method. The metal catalyst layer 130 has a hydrophobic property according to the property of Ni.

The metal catalyst layer 130 according to an exemplary embodiment is formed of Ni, but is not limited thereto. That is, there is no specific limit in selecting the material for forming the metal catalyst layer 130, and any material can be used as long as the material has a hydrophobic property and can grow graphene by absorbing carbon when a CVD method is performed. In certain embodiments, the metal catalyst layer 130 may be formed of, for example, Cu, Al, Fe, Co, or W.

The graphene 140 may have a film shape, and may be grown on an upper surface of the metal catalyst layer 130 using a CVD method.

A method of manufacturing graphene will now be described with reference to FIGS. 2 through 7, although the ordinarily-skilled artisan will readily recognize that the present invention is not limited by this method of manufacture.

FIGS. 2 through 7 are cross-sectional views illustrating a method of manufacturing graphene according to an exemplary embodiment. FIG. 8 is a flow chart showing a method of manufacturing graphene according to an exemplary embodiment.

As described above, a graphene member 100 in which graphene 140 is grown by using a CVD method is prepared (operation S1).

Figure 2:
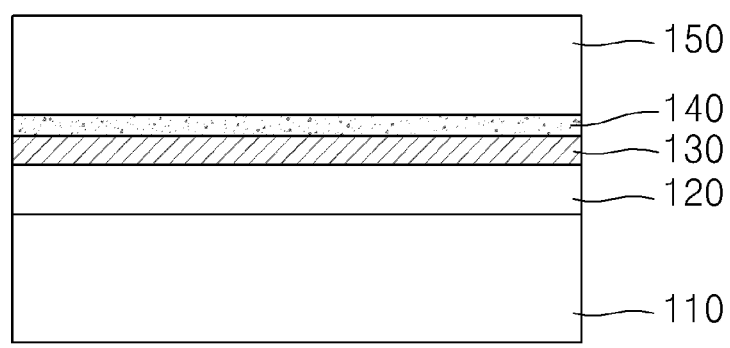
FIGS. 2 through 7 are cross-sectional views for explaining a method of manufacturing graphene according to an embodiment.

Referring to FIG. 2, a transfer member 150 is placed on an upper surface of the graphene 140 (operation S2)

The transfer member 150 may be formed of, for example, polydimethylsiloxane (PDMS).

The transfer member 150 according to an exemplary embodiment is formed of PDMS, but is not limited thereto. That is, the transfer member 150 may be formed of any material that can transfer the graphene 140. For example, in other embodiments, the transfer member 150 may be formed of, for example, polyethylene terephthalate (PET), polyimide, glass, synthesized rubber, or natural rubber.

Figure 3:
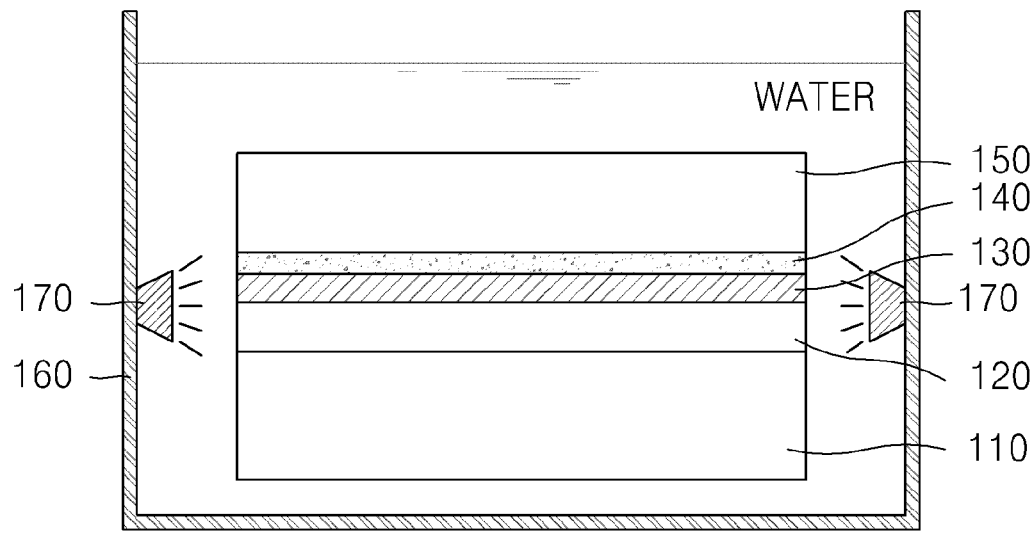

Referring to FIG. 3, the graphene member 100 on which the transfer member 150 is placed soaked in a water bath 160, and ultrasonic waves generated from an ultra sonic wave generator 170 are radiated onto the graphene member 100 (operation S3).

In Operation S3, when the graphene member 100 is soaked in the water bath 160, water generates a gap between the oxide layer 120 and the metal catalyst layer 130 by penetrating between the oxide layer 120 and the metal catalyst layer 130. This is because the oxide layer 120 has a hydrophilic property and the metal catalyst layer 130 has a hydrophobic property. In particular, ultrasonic waves generated from the ultrasonic wave generator 170 facilitate the penetration of water between the oxide layer 120 and the metal catalyst layer 130. The ultrasonic waves may be radiated onto the graphene member 100 for approximately 10 seconds. The irradiating time of the ultrasonic waves may vary according to working conditions or size and thickness of the graphene member 100.

According to an exemplary embodiment, water is applied to the graphene member 100 by soaking the graphene member 100 in the water bath 160 filled with water, but the present invention is not limited thereto. That is, there is no specific limitation in selecting the method of applying water to the graphene member 100, and any method that can evenly apply water to the graphene member 100 may be used. For example, in other embodiments, the graphene member 100 may be placed in flowing water or may be sprayed with water.

According to an exemplary embodiment, the penetration of water between the oxide layer 120 and the metal catalyst layer 130 may be increased by radiating ultrasonic waves, but the present invention is not limited thereto. That is, ultrasonic waves are not necessarily used.

Figure 4:
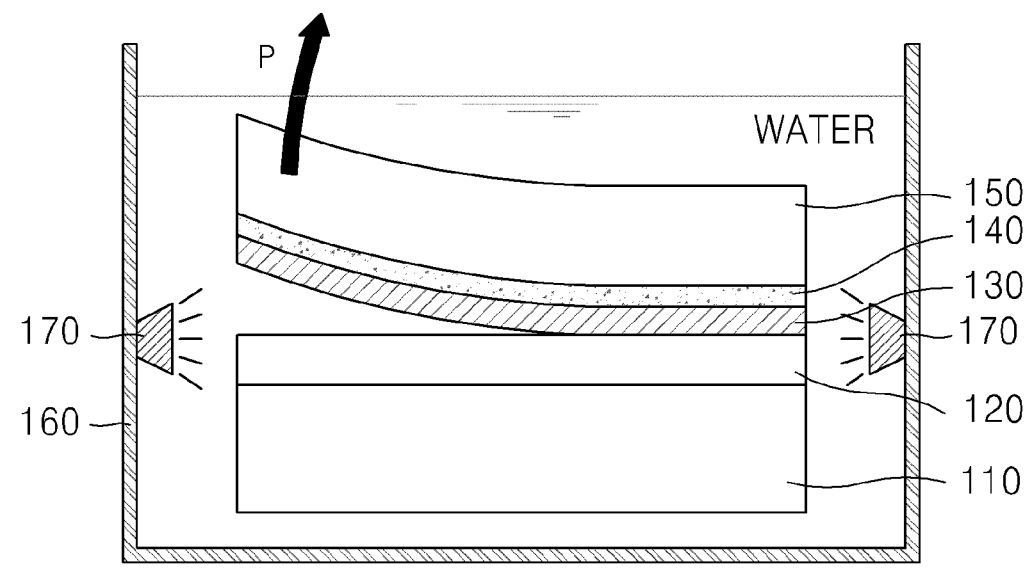

Next, referring to FIG. 4, the metal catalyst layer 130 is separated from the oxide layer 120 by applying a predetermined force P in a direction indicated by the arrow while the graphene member 100 is soaked in water in the water bath 160 (operation S4).

That is, in Operation S3, since water penetrates between the oxide layer 120 and the metal catalyst layer 130, a gap is generated between the oxide layer 120 and the metal catalyst layer 130. Thus, the metal catalyst layer 130 can be separated from the oxide layer 120 by applying a predetermined force P to the transfer member 150.

In determining the predetermined force P, a magnitude of the force P that can smoothly separate the metal catalyst layer 130 from the oxide layer 120 is determined. Also, the direction of the predetermined force P may be perpendicular to a surface where the oxide layer 120 contacts the metal catalyst layer 130, parallel to the surface where the oxide layer 120 contacts the metal catalyst layer 130, may have a predetermined slope with respect to the perpendicular direction to the surface where the oxide layer 120 contacts the metal catalyst layer 130, or may be a combination of the directions described above.

According to an exemplary embodiment, the oxide layer 120 and the metal catalyst layer 130 are separated from each other by applying the predetermined force P while the graphene member 100 is soaked in water, but the present invention is not limited thereto. That is, the oxide layer 120 and the metal catalyst layer 130 can be separated from each other by applying the predetermined force P after the graphene member 100 is taken out from water. In this case, in Operation S3, the separation may be performed only when a gap between the oxide layer 120 and the metal catalyst layer 130 is sufficiently formed.

Figure 5:
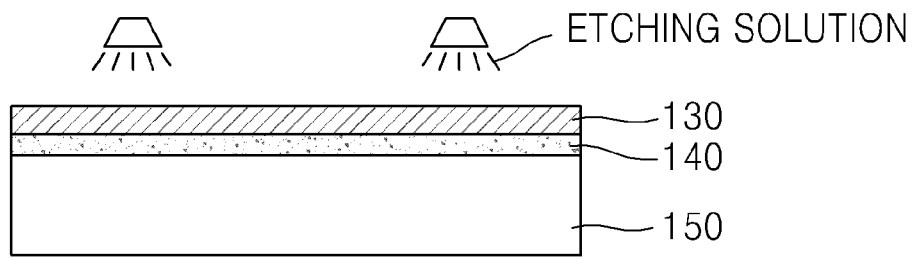

Next, referring to FIG. 5, after the transfer member 150 is taken out from the water bath 160, the metal catalyst layer 130 is removed by an etching process (operation S5).

In one embodiment, the etching process is performed using an etching solution, for example, an acid, a hydrogen fluoride solution, a buffered oxide etch (BOE) solution, a $FeCl_3$ solution, or a $Fe(No_3)_3$ solution.

The etching process according one embodiment of to the present invention is a wet etching process using an etchant, but is not limited thereto. That is, the etching process may be, for example, a dry process or a process of removing the metal catalyst layer 130 using a sputtering method.

When Operation S4 is finished, the oxide layer 120 is separated from the metal catalyst layer 130, and thus the entire surface of the metal catalyst layer 130 in Operation S5 is exposed to the outside. Accordingly, since the etchant acts uniformly on the entire surface of the metal catalyst layer 130, the process of removing the metal catalyst layer 130 can be rapidly performed.

Figure 6:
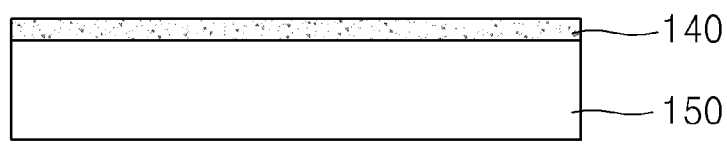

As a result, the graphene 140 transferred onto the transfer member 150 is obtained. FIG. 6 is a cross-sectional view of the transfer member 150 onto which the graphene 140 is transferred.

The state shown in FIG. 6, that is, the state in which the graphene 140 is transferred onto the transfer member 150, may not be the final one. That is, when necessary, the graphene 140 may be transferred to another transfer member from the initial transfer member 150

Figure 7:
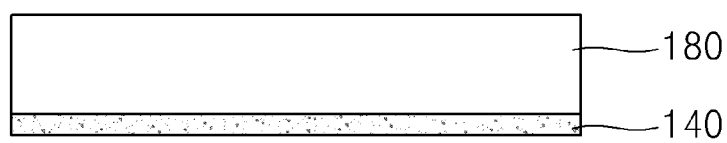
Figure 7:
Figure 8:
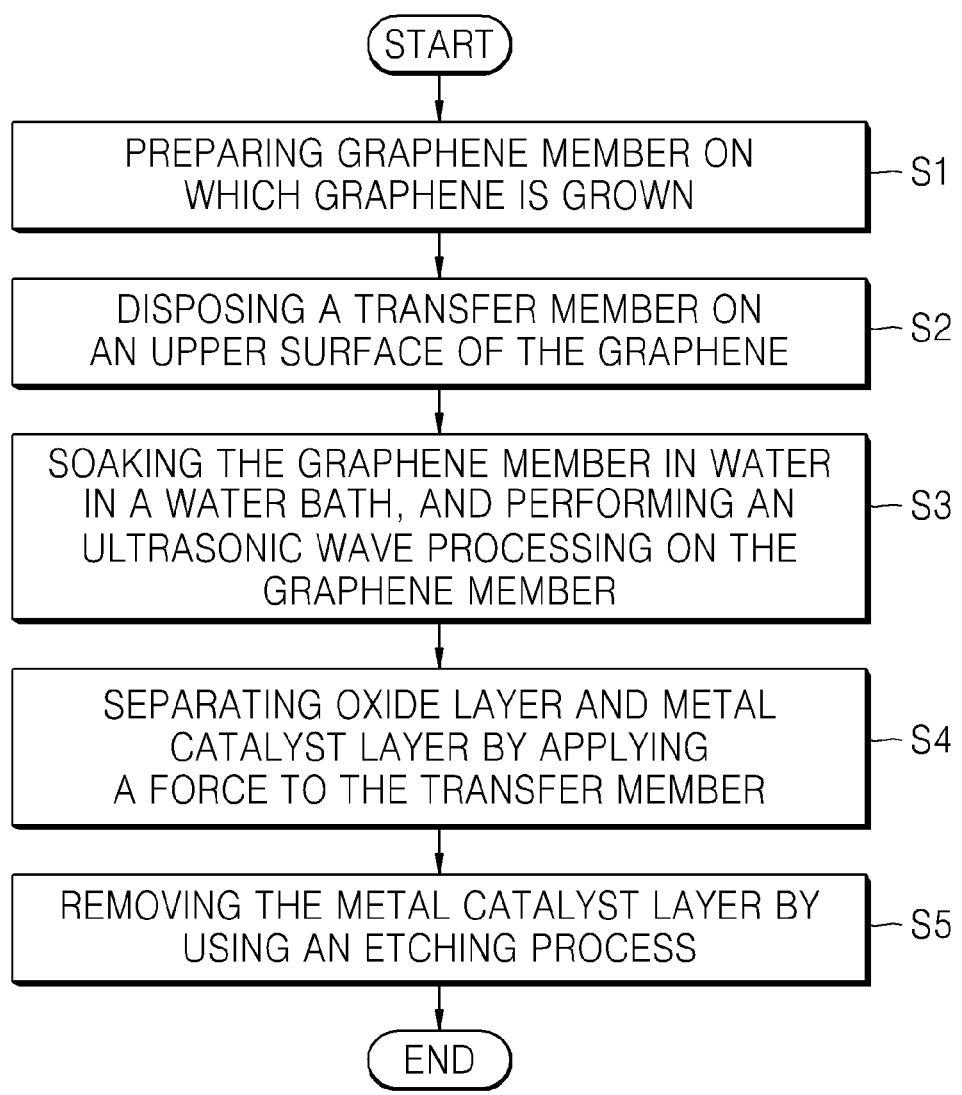
FIG. 8 is a flow chart showing a method of manufacturing graphene according to an embodiment.

For example, referring to FIG. 7, the graphene 140 may be transferred to another transfer member 180 (for example, a final transfer member formed of PET material) from the transfer member 150.

As described above, in the method of manufacturing graphene according to an exemplary embodiment, since the oxide layer 120 has a hydrophilic property and the metal catalyst layer 130 has a hydrophobic property, the separation of the oxide layer 120 from the metal catalyst layer 130 is performed using water. Therefore, the graphene 140 can be rapidly separated from the base member 110 and the oxide layer 120.

Also, according to an exemplary embodiment, since the oxide layer 120 and the metal catalyst layer 130 are separated using water, the entire surface of the metal catalyst layer 130 can be rapidly exposed to the outside. Thus, the metal catalyst layer 130 can be rapidly removed from the graphene 140 in a subsequent process. Accordingly, the transfer process of the graphene 140 can be rapidly performed.

Graphene manufactured according to the methods of the exemplary embodiments can be used for various applications such as, but not limited to, transparent electrodes, conductive thin films, radiating or heating devices, flexible display devices, organic light emitting devices, or dye-sensitized solar cells, etc.

While exemplary embodiments been shown and described, it will be understood by one of ordinary skill in the art that various changes in form and details may be made therein without departing from the spirit and scope of the inventive concept as defined by the following claims.

What is claimed is:

1. A method of manufacturing graphene, the method comprising:
preparing a graphene member comprising a base member, a hydrophilic oxide layer formed on the base member, a hydrophobic metal catalyst layer formed on the oxide layer, and graphene grown on the metal catalyst layer;
applying water to the graphene member;
separating the metal catalyst layer from the oxide layer; and
removing the metal catalyst layer using an etching process, wherein the applying water to the graphene member comprises generating a gap in between the oxide layer and the metal catalyst layer via the penetration of water between the oxide layer and the metal catalyst layer.

2. The method of claim 1, wherein the base member comprises silicon (Si).

3. The method of claim 1, wherein the oxide layer comprises silicon dioxide ($SiO_2$).

4. The method of claim 1, wherein the metal catalyst layer comprises at least a metal selected from the group consisting of Ni, Cu, Al, Fe, Co, and W.

5. The method of claim 1, wherein the preparing the graphene member further comprises disposing a transfer member onto the graphene.

6. The method of claim 5, wherein the transfer member comprises a material selected from the group consisting of polydimethylsiloxane (PDMS), polyethylene terephthalate (PET), polyimide, glass, synthesized rubber, and natural rubber.

7. The method of claim 1, wherein the applying water to the graphene member comprises ultrasonic wave processing on the graphene member by applying ultrasonic waves.

8. The method of claim 1, wherein the applying water to the graphene member comprises soaking the graphene member in water in a water bath.

9. The method of claim 8, wherein the separating the metal catalyst layer from the oxide layer is performed while the graphene member is soaked in water in the water bath.

10. The method of claim 1, wherein the separating the metal catalyst layer from the oxide layer comprises applying a predetermined force to the graphene member.

11. The method of claim 1, wherein the etching process is performed using at least one solution selected from the group consisting of an acid, a hydrogen fluoride solution, a buffered oxide etch (BOE) solution, a $FeCl_3$ solution, and a $Fe(No_3)_3$ solution.

12. The method of claim 1 further comprising, after the removing the metal catalyst layer using the etching process, transferring the graphene onto a substrate or a device.

* * * * *